United States Patent
Viviani

(10) Patent No.: US 9,753,068 B2
(45) Date of Patent: Sep. 5, 2017

(54) SYSTEMS AND METHODS FOR SIGNAL QUANTIZATION

(71) Applicant: Insitu, Inc., Bingen, WA (US)

(72) Inventor: Gary Lee Viviani, Lyle, WA (US)

(73) Assignee: INSITU Inc., Bingen, WA (US)

( * ) Notice: Subject to any disclaimer, the term of this patent is extended or adjusted under 35 U.S.C. 154(b) by 294 days.

(21) Appl. No.: 14/675,046

(22) Filed: Mar. 31, 2015

(65) Prior Publication Data

US 2016/0202297 A1 Jul. 14, 2016

Related U.S. Application Data

(60) Provisional application No. 62/103,312, filed on Jan. 14, 2015.

(51) Int. Cl.
  *G01R 23/02* (2006.01)
  *H03B 7/00* (2006.01)
  *G01D 5/243* (2006.01)

(52) U.S. Cl.
  CPC ............ *G01R 23/02* (2013.01); *G01D 5/243* (2013.01); *H03B 7/00* (2013.01)

(58) Field of Classification Search
  CPC ........ G01R 23/02; G01D 5/204; G01D 5/243; G01D 5/2006; H03B 7/00; H03B 28/00
  See application file for complete search history.

(56) References Cited

U.S. PATENT DOCUMENTS

| | | | | |
|---|---|---|---|---|
| 3,296,553 A * | 1/1967 | Reid | ......................... | H03L 5/00 331/109 |
| 5,034,704 A * | 7/1991 | Tomioka | ................ | G01V 3/102 324/236 |
| 5,065,093 A * | 11/1991 | Nauta | ..................... | G01V 3/102 324/207.12 |
| 5,079,523 A * | 1/1992 | Kleinhans | ............ | G01D 5/2225 324/207.16 |
| 6,011,477 A | 1/2000 | Teodorescu | | |
| 7,719,263 B2 * | 5/2010 | Eissner | .................. | G01D 5/202 324/207.15 |
| 2008/0048888 A1 | 2/2008 | Richley | | |
| 2011/0057668 A1 * | 3/2011 | Chen | ..................... | G01B 7/023 324/655 |
| 2011/0316558 A1 | 12/2011 | Pfaffinger | | |

FOREIGN PATENT DOCUMENTS

| | | |
|---|---|---|
| EP | 0676638 | 10/1995 |
| WO | WO 0029970 | 5/2000 |

OTHER PUBLICATIONS

Extended European Search Report for EP 16151120.9-1568, dated May 20, 2016.
Gabor, "Theory of Communication," pp. 429-441, Institution of Electrical Engineering, 1946.
Saet and Viviani, "The Stochastic Process of Transitions between Limit Cycles for a Special Class of Self-Osciallators under Random Perturbations," IEEE Transations on Circuits and Systems, vol. Cas-34, No. 6, Jun. 1987.

(Continued)

*Primary Examiner* — Minh N Tang
(74) *Attorney, Agent, or Firm* — Joseph M. Butscher; The Small Patent Law Group, LLC

(57) ABSTRACT

Embodiments of the present disclosure provide a system for detecting and precisely measuring information content of one or more environmental conditions. The system may include a plurality of oscillator circuits that are coupled together. The coupling of the oscillator circuits generates an output signal having a pattern of amplitude and frequency. The pattern of amplitude and frequency changes as one or more values of the environmental condition(s) change.

22 Claims, 5 Drawing Sheets

(56) References Cited

OTHER PUBLICATIONS

Saet and Viviani, "On Transitions Between Quasilinear and Relaxational Regimes in Self Osciallators," CH2458-8/88/0000-0735, IEEE (1988).
Saet and Viviani, "Quasilinear and Relaxational Realms in Multiple Regime Self-Oscillators," Inst. J. Non-Linear Mechanics, vol. 26, No. 5, 1991.
Saet and Viviani, "Multi-Stable Periodical Devices with Variations on the Theme of Van der Pol" Journal of the Franklin Institute, 1984.
Saet and Viviani, "An Unorthodox Paradigm of a Relaxational Self-Oscialltor and Some Classes of Nonlinear One-ports," Journal of the Franklin Institute, 1986.
Saet and viviania, "On Lienard Oscillator Models with a Pregiven Set of Limit Cycles," Mathematical Modelling, vol. 7, pp. 377-384 (1986).
Viviania and Saet, "A Practical Algorithm for Numerical Determination of Periodical Regimes in Nonlinear Oscillators," International Journal for Computation and Mathematics in Electrical and Electronic Engineering, vol. 5, No. 3, 127-136 (1986).
Viviani and Seat, New type of multi-state detector for adaptive control: an application to network switching, Int. J. Electronics, vol. 60, No. 4, 531-533 (1986).
Viviani, "On Synthesis and Design of Mutli-Stable Devices," CH2458-8/988/0000-0739, IEEE (1988).

* cited by examiner

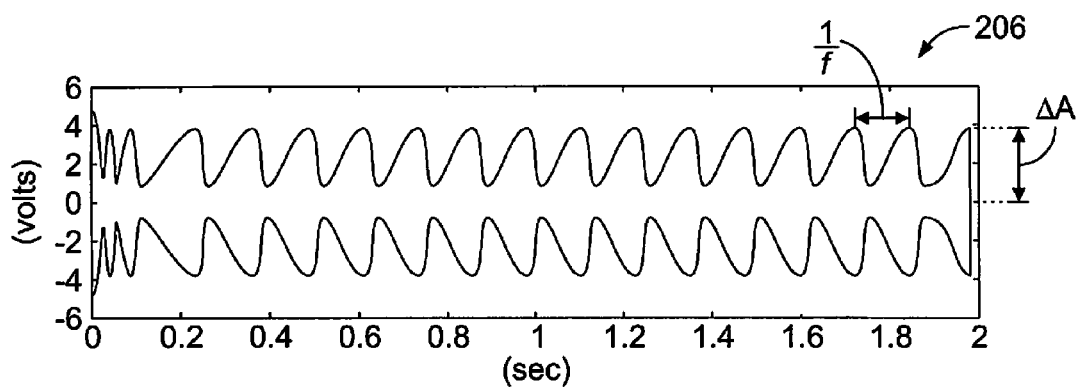
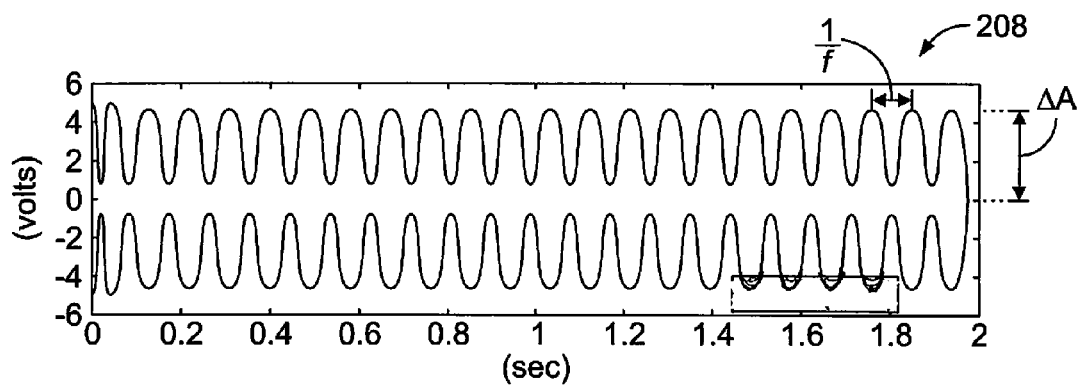
FIG. 2Cont.

SYSTEMS AND METHODS FOR SIGNAL QUANTIZATION

RELATED APPLICATIONS

This application relates to and claims priority benefits from U.S. Provisional Patent Application No. 62/103,312, entitled "Quantum Detector Assembly, System and Method," filed Jan. 14, 2015, which is hereby incorporated by reference in its entirety.

FIELD OF THE DISCLOSURE

Embodiments of the present disclosure generally relate to systems and methods for quantizing signals, and, more particularly, to systems and methods for quantizing signals to measure or otherwise detect one or more environmental conditions.

BACKGROUND OF THE DISCLOSURE

As described in "Theory of Communication," by Gabor, the concept of information is directly related to the concept of Heisenberg's Uncertainty Principle. By change of a variable, the momentum and position of a particle are equivalently represented in terms of time (typically represented as amplitude) and frequency of an associated signal, which may be characterized as a unit of information. Typical measuring or detecting devices measure what can be either considered a time domain, or else a frequency domain signal, but not both.

In a variety of settings and applications, environmental conditions are detected by various types of sensors. For example, thermometers are used to detect ambient temperature, barometers are used to detect atmospheric pressure, altimeters are used to detect altitude of a plane, speedometers are used to detect a velocity of a vehicle, and the like. In general, a wide variety of sensors and detectors may be used to sense a wide variety of environmental conditions.

Digital sensors are often used to detect environmental conditions. Various known digital sensors include one or more processors that process received data that is output by one or more sensing elements. As can be appreciated, a time delay may exist between a first time when a digital sensor receives data from a sensing element, and a second time when the digital sensor generates a calculation regarding the environmental condition. Further, many digital sensors often include multiple processing components that add cost and complexity to the sensor assemblies. Also, sensors, whether digital or analog, may prove unreliable over time, such that they do not produce precise determinations of a particular environmental condition.

Accordingly, a need exists for an efficient, reliable, and precise system and method for detecting one or more environmental conditions.

SUMMARY OF THE DISCLOSURE

Certain embodiments of the present disclosure provide a system for detecting one or more environmental conditions. The system may include a plurality of oscillator circuits that are coupled together. The coupling of the oscillator circuits generates an output signal having a pattern of amplitude and frequency. The pattern of amplitude and frequency changes as one or more values of the environmental condition(s) change.

Each of the plurality of oscillator circuits may include multiple negative resistance non-linearities that provide multiple stable equilibriums. In at least one embodiment, the system is devoid of a separate and distinct reference source.

The multiple negative resistance non-linearities and/or the multiple stable equilibriums of the plurality of oscillator circuits may be different. For example, the multiple negative resistance non-linearities of a first oscillator circuit may be different than those of a second oscillator circuit. As another example, the multiple state equilibriums of a first oscillator circuit may be different than those of a second oscillator circuit. In another embodiment, the multiple negative resistance non-linearities and/or the multiple stable equilibriums of each of the oscillator circuits may be the same.

The oscillator circuits may be electromagnetically coupled together. Alternatively, or additionally, the oscillator circuits may be mechanically and/or chemically coupled together.

The environmental condition(s) may include attitude, altitude, position within a volume, velocity, temperature, pressure, or light intensity. Alternatively, various other environmental conditions may be detected by the system.

The system may also include a pattern recognition unit operatively coupled to the plurality of oscillator circuits. The pattern recognition unit is configured to receive the output signal and determine the value(s) of the environmental condition(s) by analyzing the pattern of amplitude and frequency.

In at least one embodiment, one or more of the oscillator circuits may include at least one inductor connected in parallel with at least on capacitor. The oscillator circuits may be operated and controlled with direct current voltage.

Certain embodiments of the present disclosure provide a method of detecting one or more environmental conditions. The method may include coupling a plurality of oscillator circuits together, and generating an output signal having a pattern of amplitude and frequency through the coupling operation. The pattern of amplitude and frequency changes as one or more values of the environmental condition(s) change.

Certain embodiments of the present disclosure provide a vehicle that may include a main body including an internal cabin, and one or more systems for detecting one or more environmental conditions secured on or within the main body. The vehicle may be an aircraft, for example.

DETAILED DESCRIPTION OF THE DISCLOSURE

Figure 1:
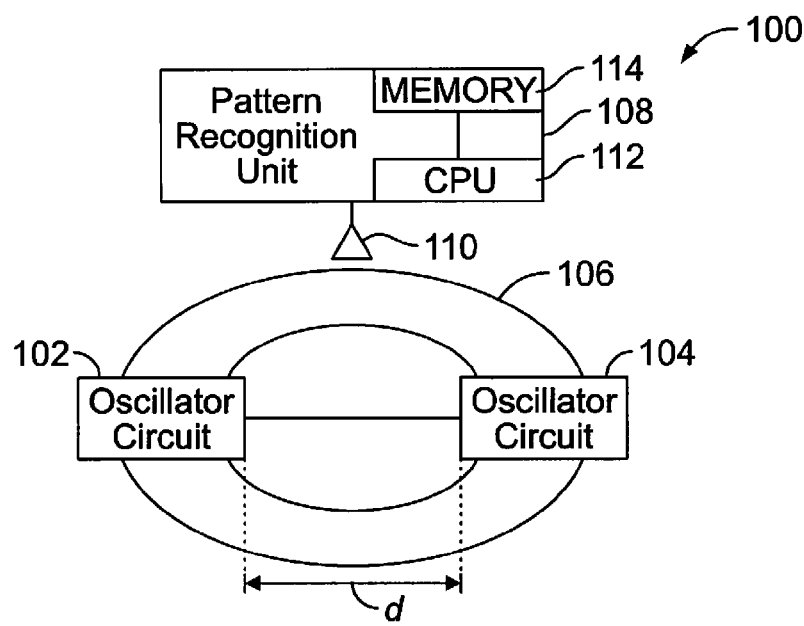
FIG. 1 illustrates a schematic block diagram of a system for detecting one or more environmental conditions, according to an embodiment of the present disclosure.

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Atomic level structures provide stationary patterns amenable to recognition. Embodiments of the present disclosure provide similar system synthesis of such stable patterns. For example, atomic level structures have multiple equilibriums (orbitals). In a similar manner, embodiments of the present disclosure provide multi-stable self-oscillators or oscillator circuits. An energy source for the system may be derived from applied junction biases. Embodiments of the present disclosure provide predetermined stable oscillations akin to multiple orbitals at the atomic level. Once established at a particular orbital or phase plane oscillation, a system remains at that orbital or phase plan oscillation until perturbed by a stimulus, such as one or more changing environmental conditions.

Certain embodiments of the present disclosure provide a system for detecting and measuring a signal having information content that may be associated with one or more environmental conditions. A unique pattern of time and frequency of the signal includes at least one unit of information content. Accordingly, embodiments of the present disclosure instantaneously detect information from a unique signal pattern that may be induced by a specific environmental condition that affects the system.

Certain embodiments of the present disclosure provide a system and method of detecting one or more environmental conditions (for example, conditions induced by an environment in which the system resides), such as altitude, attitude of a vehicle within a space, velocity, temperature, pressure, relative position in space, and/or the like. Embodiments of the present disclosure provide a system that may include a plurality of multi-stable devices that may utilize quantum mechanical-like methods in order to provide instantaneous determinations of one or more environmental conditions. Embodiments of the present disclosure provide a detection system and method that is efficient, economical, and reliable. In at least one embodiment, the system and method may be used to detect an attitude of a vehicle based on one or more determinations of a position within the magnetic field of the Earth.

Embodiments of the present disclosure provide systems and methods that may provide instantaneous indications of one or more environmental conditions based on an output, such as a pattern, code, or the like, that may be a unique with respect to amplitude and frequency. For example, a specific, unique output (that may include an amplitude envelope, frequency envelope, and a carrier frequency) may be indicative of a particular environmental state. A first output signal, such as a waveform having amplitude and frequency components, may be indicative of a first environmental state, a second output signal, such as a waveform having amplitude and frequency components (that differs from the first output), may be indicative of a second environmental state (that differs from the first environmental state), a third output signal, such as a waveform having amplitude and frequency components, may be indicative of a third environmental state (that differs from the first and second environmental states), and so on.

In at least one embodiment, a detection system or apparatus may include a first oscillator circuit or self-oscillator having multiple negative resistance non-linearities that give rise to multiple stable equilibriums, and a second oscillator circuit or self-oscillator having multiple negative resistance non-linearities that give rise to multiple stable equilibriums. The first and second self-oscillator circuits are coupled to one another, such as through an electromagnetic coupling.

Each oscillator circuit may be a multi-stable device that has multiple stable equilibriums. In response to a stimulus, such as a changing environmental condition, the oscillator circuit(s) may instantaneously transition to one of multiple stable equilibrium states. For example, in response to a first value of an environmental condition (such as a first position within the magnetic field of the Earth), the oscillator circuit(s) may be in a first stable state. As the environmental condition changes to a second value (such as a second position within the magnetic field of the Earth), the oscillator circuit(s) may transition to a second stable state that differs from the first stable state. Instead of having only two stable states, the oscillator circuit(s) may have N stable states, each of which may correlate with an energy of a different value of one or more environmental condition(s). Each value of the environmental condition(s) represents a different stimulus having a different energy, which transitions the oscillator circuit(s) to a different stable state, akin to the behavior of an atomic structure having multiple orbitals. Once established at a particular stable state, the oscillator circuit(s) remains at the particular stable state until perturbed by changing environmental conditions, for example.

Negative resistance, which may also be referred to as negative conductance, is a general electrical property in which an increase in voltage causes a decrease in electric current therethrough (in contrast to a typical resistor in which an increase in voltage causes a proportional increase in current, resulting in a positive resistance). While a positive resistance consumes power, a negative resistance generates power. Negative resistance is a characteristic of an oscillator circuit. Moreover, an oscillator circuit with multiple stable equilibria (oscillations, also known as domains of attraction) has multiple negative resistance regions of interest.

Further, the oscillator circuits may be non-linear in that they do not exhibit a linear relationship between current and voltage. That is, in a non-linear system, a slope of voltage in relation to current is not a straight line over an entire range of interest.

In at least one embodiment, the multiple negative resistance non-linearities of the first oscillator circuit are different than the multiple negative resistance non-linearities of the second oscillator circuit. Alternatively, the multiple negative resistance non-linearities of the first oscillator circuit may be the same as the multiple negative resistance non-linearities of the second oscillator circuit.

In at least one embodiment, the number of multiple stable equilibriums for the first oscillator circuit is different than the number of multiple stable equilibriums for the second oscillator circuit. Alternatively, the number of multiple stable equilibriums for the first oscillator circuit may be the same as the number of multiple stable equilibriums for the second oscillator circuit.

The system may also include a third oscillator circuit or self-oscillator having multiple negative resistance non-linearities that give rise to multiple stable equilibriums. The third oscillator circuit may be coupled to one or both of the first and second oscillator circuits, such as through electromagnetic coupling. For example, the oscillator circuits may be separated from one another by a distance over which an electromagnetic field exists between the oscillator circuits.

Each oscillator circuit may include discrete components. Alternatively, each oscillator circuit may be formed on and/or include a single semiconductor chip, for example.

As noted, the oscillator circuits may be electromagnetically coupled to one another. Alternatively, the oscillator circuits may be mechanically and/or chemically coupled to one another.

The coupled oscillator circuits generate an output signal that may be represented by a waveform that is a combination of stable amplitude (or time) and frequency patterns for one or more environmental conditions. For example, a first value of one or more environmental condition(s) may cause the coupled oscillator circuits to generate a first output (such as an electromagnetic field) having a unique amplitude and frequency pattern. As the value of the environmental condition changes to a second value that differs from the first value, the output signal changes, such that it differs from the initial output signal. The changing output signal may be defined by a different amplitude and frequency pattern, and may be recognizable. As such, the system provides instantaneous determinations or results without computations, with the possible exception of computations as may be used to recognize that a pattern may have changed. The system may recognize different patterns of amplitude and frequency as being associated with different values of one or more environmental conditions.

In at least one embodiment, an environmental condition may be an attitude of a vehicle. The attitude may be detected by measuring the magnetic field of the Earth, for example. In at least one other embodiment, an environmental condition may be a position of a structure that includes the detection system in relation to another structure within a particular area, volume, or space.

The system may also include a pattern recognition unit operatively coupled to the oscillator circuits. The output signal generated by the oscillator circuits may be received by the pattern recognition unit, which may, in turn, determine a value of an environmental condition based on an analysis of a received pattern of amplitude of frequency of the output signal. Because the system may be calibrated in advance and the patterns may be quantized and reproducible, the pattern recognition unit may utilize a lookup table, for example, to recognize and match a pattern with an associated value, for example.

In at least one embodiment, each oscillator circuit may include at least one inductor connected in parallel with at least one capacitor. Each oscillator circuit may be powered with direct current (DC) voltage, which provides stable operation. The DC voltage, in combination with negative resistance elements, may determine a desired shape of non-linearity that gives rise to multiple stable equilibriums.

By virtue of equivalent circuit considerations, certain embodiments of the present disclosure may provide a dual circuit in which voltage sources may be replaced by current sources, inductors may be replaced by capacitors, capacitors may be replaced with inductors, and a voltage controlled nonlinear resistor may be replaced by a current controlled nonlinear resistor. Thus, for each embodiment described in the present application, a counterpart equivalent circuit, as noted, may alternatively be used. Coupling between oscillator circuits may occur in a dual manner involving either the magnetic field or the electric field (or both fields). In particular, in a dual circuit configuration, references to DC voltage may be realized in equivalent DC current sources, and all pertinent properties may be considered to be the same, with the appropriate change of variables.

In at least one embodiment, each oscillator circuit may include one or more field-effect transistors (FETs), and/or one or more bipolar junction transistors (BJTs). With respect to duality considerations, where N-channel components are indicated, the dual circuit may be characterized by P-channel devices.

FIG. 1 illustrates a schematic block diagram of a system 100 for detecting one or more environmental conditions, according to an embodiment of the present disclosure. The system 100 may include a first oscillator circuit 102 coupled to a second oscillator circuit 104. For example, the first oscillator circuit 102 may be electromagnetically coupled to the second oscillator circuit 104 through an electromagnetic field 106 that is generated by the interaction of the first and second oscillator circuits 102 and 104. The electromagnetic field 106 may provide an output signal of the interacting first and second oscillator circuits 102 and 104. The first and second oscillator circuits 102 and 104 may be spaced apart from one another by a distance d that allows the electromagnetic field 106 to exist between the first and second oscillator circuits 102 and 104. Alternatively, the system 100 may include more oscillator circuits than shown. For example, the system 100 may include three or more oscillator circuits that are coupled to at least one of the other oscillator circuits.

A pattern recognition unit 108 may be operatively coupled to (or otherwise in communication with) the first and second oscillator circuits 102 and 104 to detect the electromagnetic field 106. For example, the pattern recognition unit 108 may be electrically connected to the first and second oscillator circuits 102 and 104 through wired or wireless connections, and/or part of a circuit that electrically connects the pattern recognition unit 108 to each of the first or second oscillator circuits 102 and 104. The pattern recognition unit 108 may include a coupling sensing device 110, such as an antenna, that is configured to detect the electromagnetic field 106. The coupling sensing device 110 is in communication with a central processing unit (CPU) 112, which may be in communication with or otherwise include, a memory 114 that stores programs, instructions, and the like that govern operation of the pattern recognition unit 108. In short, the pattern recognition unit 108 may be or include a circuit that includes one or more processors (such as microprocessors, microcontrollers, etc.), one or more memories, and/or the like that are configured to recognize waveform patterns of amplitude and frequency that are output by the coupled oscillator circuits 102 and 104. The output or output signal may be the electromagnetic field 106. For example, the electromagnetic field 106 may be detected as, provide, and/or carry a waveform that includes amplitude and frequency components that change in relation to one or more changing environmental conditions. Alternatively, the system 100 may not include the pattern recognition unit 108.

In operation, an environmental condition having a first value may cause the coupled oscillator circuits 102 and 104 to output a characteristic output signal, which may be (or otherwise be carried by) the electromagnetic field 106. For example, at a first position within the magnetic field of the Earth, the output signal may be defined by a waveform having a first pattern of amplitude and frequency, such as a particular first amplitude and frequency pattern. The pattern recognition unit 108 detects the output signal and determines that the value of the environmental condition is the first value. For example, the pattern recognition unit 108 may match the received amplitude and frequency pattern of the output signal with a stored pattern in the memory 114 that is indicative of the first value, which may be a first position within the magnetic field of the Earth. The first output signal is caused by the first value of the environmental condition, which may cause both the first and second oscillator circuits 102 and 104 to be at a first stable equilibrium. In this manner, the first and second oscillator circuits 102 and 104 are in the first stable equilibrium state.

The first and second oscillator circuits 102 and 104 are in the first stable equilibrium state due to the energy of the first value of the environmental condition. As the first value changes to a second value having a different energy, the first and second oscillator circuits 102 and 104 may instantaneously transition to a second stable equilibrium state, thereby generating an output signal having a waveform with a different amplitude and frequency pattern or signature. As such, the system 100 provides predetermined stable oscillations akin to multiple orbitals at the atomic level. Once the oscillators 102 and 104 are in a particular stable equilibrium state, the system 100 remains at that state until perturbed by a stimulus, such as a changing energy value of one or more changing environmental condition(s).

The stable equilibrium states of each of the first and second oscillator circuits 102 and 104 may be the same or different. For example, each of the first and second oscillator circuits 102 and 104 may have one hundred stable equilibrium states defined by the same energy values for each state. Optionally, the first oscillator circuit 102 may have a first number of stable equilibrium states, while the second oscillator circuit 104 may have a second number of stable equilibrium states that differs from the first number. The precision and accuracy of the system 100 may increase as the number of stable equilibriums of the first and second oscillator circuits 102 and 104 increases.

As noted, as the value of the environmental condition changes to a second value, the output signal (for example, the electromagnetic field 106) changes, such that a second pattern of amplitude and frequency differs from the first pattern associated with the first value of the environmental condition. The pattern recognition unit 108 detects the output signal and determines that the value of the environmental condition is the second value. For example, the pattern recognition unit 108 may match the received amplitude and frequency pattern of the output signal with a stored pattern in the memory 114 that is indicative of the second value, which may be a second position within the magnetic field of the Earth. The second output signal may cause both the first and second oscillator circuits 102 and 104 to be at a stable equilibrium state, which, in turn, causes the output signal, such as the electromagnetic field, to be at a second state.

The stable equilibrium states of the oscillator circuits may be associated with separate and distinct values of the environmental condition. For example, the environmental condition may be an attitude of a vehicle, such as an aircraft. Attitude information may include Euler angles associated with the orientation of the vehicle. For example, the Euler angles may include a body axis pitch angle, a body axis roll angle, and a body axis yaw angle. One or both of the first and second oscillator circuits 102 and 104 may include a number of stable equilibrium states that coincide with all possibilities of the Euler angles, for example.

In at least one embodiment, the environmental condition may be an altitude of a vehicle. Altitude information may include altitude gradients, for example. The oscillator circuits may include a number of stable equilibrium states that coincide with a specified number of altitude gradients.

In at least one embodiment, the environmental condition may be an ambient temperature. The first and second oscillator circuits 102 and 104 may include a number of stable equilibrium states that coincide with specific temperatures.

The environmental conditions may be various other types. One or more values of a particular environmental condition may be calibrated with the output signal(s) of the coupled first and second oscillator circuits 102 and 104. The output signals may be correlated with respective equilibrium states of the first and second oscillator circuits 102 and 104. At a first value of an environmental condition, the output signal may provide a first waveform having a first amplitude and frequency pattern. At a second value of the environmental condition, the output signal may provide a second waveform having a second amplitude and frequency pattern. In at least one embodiment, by determining the first and second values associated with the first and second patterns of amplitude and frequency, all other values may be determined through analysis of the change between the first and second patterns, for example.

Further, the system 100 may be configured to detect values of multiple environmental conditions at the same time. For example, the output signal of the first and second oscillator circuits 102 and 104 may provide a first waveform having a first pattern of amplitude and frequency at a first temperature, at a first altitude, and at a first vehicle attitude. As the environmental conditions change, the pattern of amplitude and frequency may change, which provides instantaneous information with respect to the multiple environmental conditions. In such an embodiment, a first temperature, at a first altitude and first vehicle attitude may cause a first output signal having a first characteristic waveform pattern of amplitude and frequency. The first temperature, at a second altitude and the first vehicle attitude may cause a second output signal having a second characteristic waveform pattern of amplitude and frequency that differs from the first characteristic waveform pattern. As one or more of the environmental conditions changes, the characteristic waveform pattern may change in response thereto.

Each of the first and second oscillator circuits 102 and 104 may have multiple negative resistance non-linearities that give rise to the multiple stable equilibriums. The multiple negative resistance non-linearities of the first oscillator circuit 102 may be different from the multiple negative resistance non-linearities of the second oscillator circuit 104. Alternatively, the multiple negative resistance non-linearities of the first oscillator circuit 102 may be the same as the multiple negative resistance non-linearities of the second oscillator circuit 104. Further, the number of multiple stable equilibriums for the first oscillator circuit 102 may be the same or different than the number of multiple stable equilibriums for the second oscillator circuit 104.

As noted, the first and second oscillator circuits 102 and 104 may be electromagnetically coupled to one another such that the electromagnetic field 106 is generated therebetween. The electromagnetic field 106 may provide the output signal of the interacting first and second oscillator circuits 102 and 104. Alternatively and/or optionally, the first and second oscillator circuits 102 and 104 may be mechanically and/or chemically coupled to one another. For example, the first and second oscillator circuits 102 and 104 may be connected with a mechanical link, such as a damper, that moves in relation to an output signal of the coupled oscillator circuits. Also, for example, a chemical may be disposed between the oscillator circuits that chemically reacts in relation to an output signal of the first and second oscillator circuits 102 and 104.

Each of the first and second oscillator circuits 102 and 104 may be autonomous and may represent a quantum mechanical building block. Each of the first and second oscillator circuits 102 and 104, which may be autonomous, provides multi-stable self-oscillations, for example. It is to be understood, that the oscillator circuits discussed throughout the application may be autonomous oscillator circuits.

The system 100 may rely on a non-linearity that includes multiple non-linear negative resistance regions. The non-linearity may be achieved by combining multiple elements, such as the first and second oscillator circuits 102 and 104, which may be particular biased junctions derived from associated semiconductor structures. For example, each oscillator circuit 102 and 104 may include one or more FET or BJT transistors.

An energy source for the system may be derived from applied junction biases. As the first and second oscillator circuits 102 and 104 may be self-oscillators, the source of energy may be derived from direct current (DC) voltages that are also used to achieve a desired shape of the non-linearity, $F(x)$, for example. The term $F(x)$ may represent a generalized nonlinear resistor, in which x represents a voltage. As noted above, however, in an equivalent circuit, the x may represent a current. As indicated above, the system 100 provides predetermined stable oscillations akin to multiple orbitals at the atomic level. The achieved stable oscillation may be selectable and may be a function of initial conditions applied to the system 100. Once established at a particular orbital or phase plane oscillation (for example, an equilibrium state), the system 100 may remain at that state until perturbed by one or more changing environmental conditions.

The system 100 may provide multiple zones of stability at which an output signal may reside. The zones of stability may be quantized, akin to an atomic structure. Transitions between the multiple zones of stability (such as caused by changing values of one or more environmental conditions) may be immediate, instantaneous, or the like (such as being difficult, if not impossible, to perceive). Based on the phase plane characteristics of the system 100, each transition may be caused by a different corresponding energy.

The first and second oscillator circuits 102 and 104 may be multi-stable self-oscillators that may be synthetic approximations of atomic level dynamics. As such, each of the first oscillator circuits 102 and 104 may be akin to an atom. The interaction of multiple oscillator circuits 102 and 104 (and, alternatively, additional oscillator circuits) provides the system with the ability to detect various environmental conditions. The system 100 may be viewed as a synthetic electro-dynamic molecule with correspondingly fast convergence to stable orbitals. The output signal of the system 100 provides for both amplitude and frequency discrimination that is discernable, precise, rapid, and suitable for complex recognition tasks. The system 100 may provide a virtual quantum-well multi-state oscillator.

Figure 2:
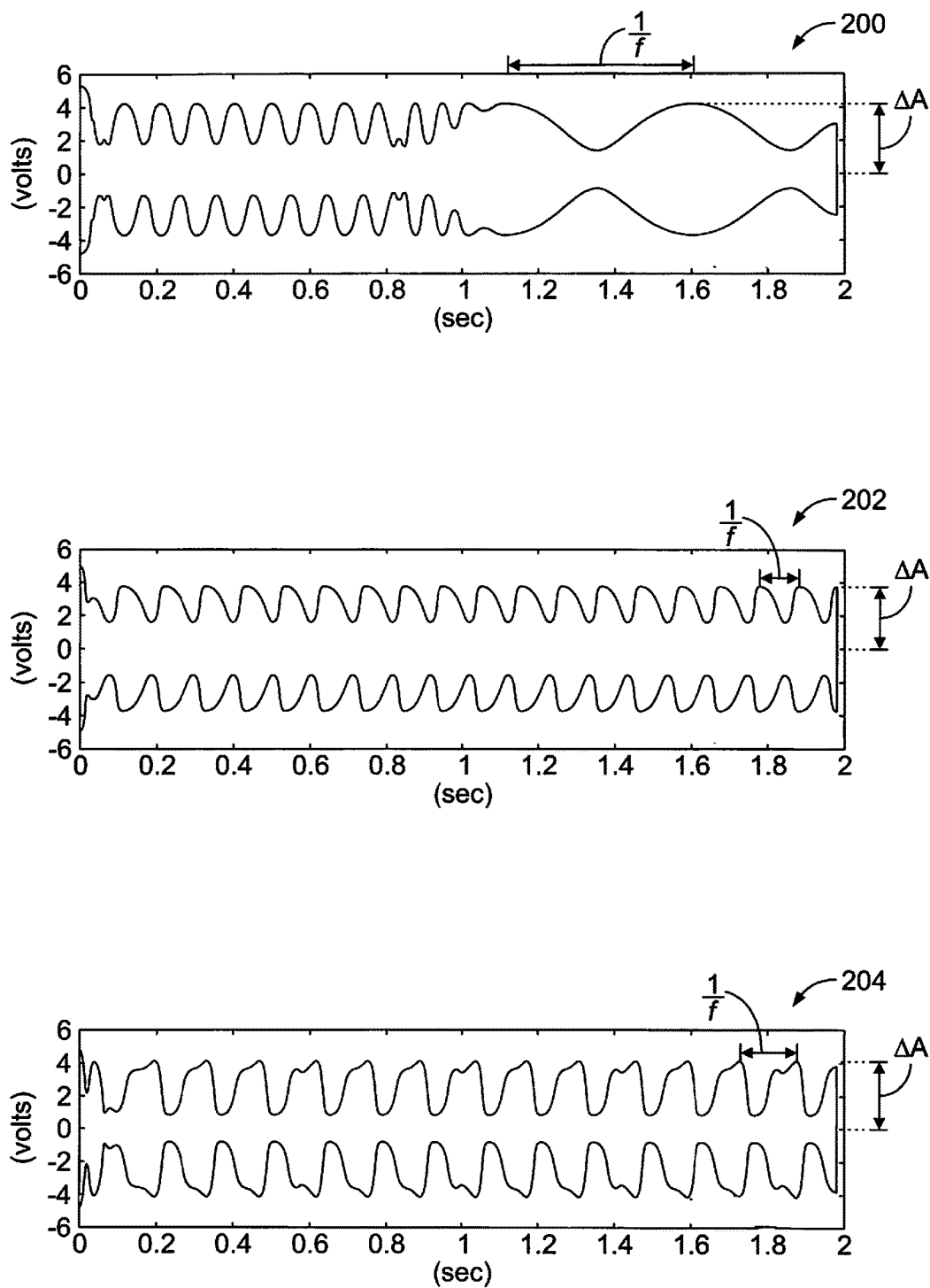
FIG. 2 is a diagrammatic representation of output signal patterns for different values of environmental conditions, according to an embodiment of the present disclosure.

FIG. 2 is a diagrammatic representation of output signal patterns 200, 202, 204, 206, and 208 for different values of environmental conditions, according to an embodiment of the present disclosure. Referring to FIGS. 1 and 2, the coupled first and second oscillator circuits 102 and 104 generate an output signal, such as the electromagnetic field 106, in response to an environmental condition. The output signal may include and/or be detected as a waveform that is a combination of stable amplitude and frequency (or time) patterns associated with different values of one or more environmental conditions.

FIG. 2 shows pertinent envelopes of the signals of interest. It is to be understood, however, that there may be higher frequency oscillation patterns between the upper and lower bounds of the indicated symmetric envelope pattern that contain both pertinent amplitude and frequency indications that may form the associated signal information content.

Frequency and amplitude may refer to an envelope shape of an output signal. Amplitude may be associated with a shape of the output signal, while frequency may be associated with a rate at which the pattern repeats.

For example, a first environmental condition value may cause the coupled first and second oscillator circuits 102 and 104 to generate a first output having a unique amplitude and frequency pattern, as shown by the output signal pattern 200. As the environmental condition value changes to a second value that differs from the first value, the second output pattern 202 is generated. Similarly, as the environmental condition value changes to a third value that differs from the first and second values, the third output pattern 204 is generated. Further, as the environmental condition value changes to a fourth value that differs from the first, second, and third values, the fourth output pattern 206 is generated. As shown, each output signal pattern 200, 202, 204, and 206 includes a unique pattern having different amplitude values and different frequency patterns. For example, an amplitude envelope AA (as measured from greatest amplitude absolute value to lowest amplitude absolute value over a period of time) and average frequency (such as measured between adjacent waveform upstrokes or downstrokes, for example, over a period of time) may be different for each output signal pattern 200, 202, 204, and 206, as shown in FIG. 2. Each output signal pattern 200, 202, 204, 206, and 208 is associated with a unique value for the environmental condition. Accordingly, the system 100 provides instantaneous determinations of the values for the environmental condition(s) without cumbersome computations.

The changing value of an environmental condition produces a signal output having a unique amplitude and frequency pattern. The unique pattern is associated with the particular value of the environmental condition. As such, embodiments of the present disclosure may provide unique patterns of amplitude and frequency that indicate an instantaneous determination of the value of the environmental condition. For example, particular values of the environmental condition are associated with unique waveform patterns or signatures of amplitude and frequency. By identifying amplitude and frequency within the waveform patterns, specific values of one or more environmental conditions may be uniquely identified.

As shown in FIG. 2, the environmental condition may cause the oscillator circuits to generate an output signal that includes a voltage (and optionally a current) component. The relationship between the current and voltage may form a waveform having a pattern of amplitude and frequency, as shown. Once an environmental stimulus or value causes a particular waveform to be output by the oscillator circuits, the waveform remains stable (that is, remains at that state of equilibrium) until an environmental stimulus or value perturbs the waveform and causes it to transition to another waveform having a different pattern of amplitude and frequency variations.

Changing environmental stimuli or values may change a mutual coupling between the oscillator circuits. The mutual coupling may be an electromagnetic field, which may represent the output signal of the oscillator circuits. Unique waveform patterns of amplitude and frequency of the mutual coupling are created by the changing environmental stimuli or values. The pattern recognition unit may detect the instantaneous pattern and associate it with a particular value of the environmental condition.

Additionally, embodiments of the present disclosure may not utilize a separate and distinct reference oscillation. Accordingly, embodiments of the present disclosure may be precisely calibrated. The waveform patterns of amplitude and frequency are unique and may not rely on a separate and distinct reference source.

Figure 3:
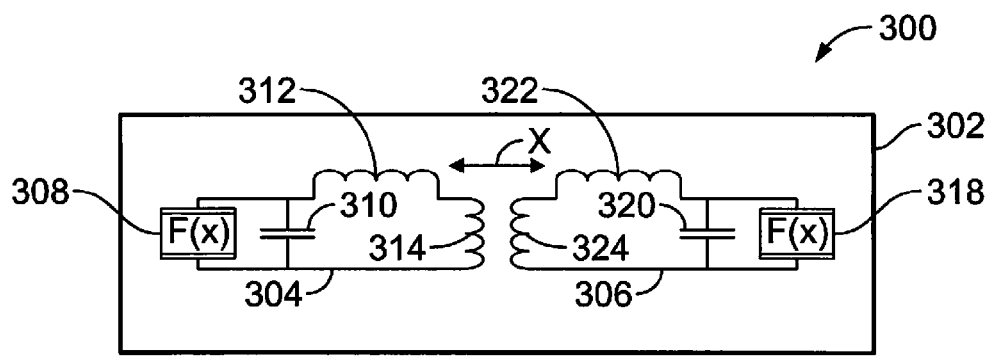
FIG. 3 illustrates a schematic circuit diagram of a system for detecting one or more environmental conditions, according to an embodiment of the present disclosure.

FIG. 3 illustrates a schematic circuit diagram of a system 300 for detecting one or more environmental conditions, according to an embodiment of the present disclosure. The system 300 is an example of the system 100 shown in FIG. 1. The system 300 includes a substrate 302 (such as a printed circuit board (PCB), a semiconductor, and/or the like) that supports a first oscillator circuit 304 coupled to a second oscillator circuit 306. As shown, the first and second oscillator circuits 304 and 306 may be supported by the same substrate 302. Alternatively, each of the first and second oscillator circuits 304 and 306 may be supported on separate and distinct substrates. The oscillator circuits 304 and 306 may be oriented in a different fashion than shown. For example, while FIG. 3 illustrates that inductors 314 and 324 may be aligned in a mirror image orientation, the oscillator circuits may be oriented differently, such as by having resistors 308 and 318 proximally positioned to one another.

There may be no external functions in relation to the system 300. All voltages may be DC. Oscillatory behavior may be derived from multiple negative resistance non-linearities of the oscillator circuits 304 and 306.

The first oscillator circuit 304 may include a nonlinear resistor 308 (having multiple negative resistance regions) that is connected in parallel with a capacitor 310, which is, in turn, connected in parallel with first and second inductors 312 and 314 that are connected in series to one another. Similarly, the second oscillator circuit 306 may include a nonlinear resistor 318 (having multiple negative resistance regions) that is connected in parallel with a capacitor 320, which is, in turn, connected in parallel with first and second inductors 322 and 324 that are connected in series to one another. The first and second oscillator circuits 304 and 306 are coupled together through an electromagnetic field, for example, which may provide a signal output of the coupled first and second oscillator circuits 304 and 306 that is, includes, and/or is detected as a waveform that includes amplitude and frequency components. Each of the first and second oscillator circuits 304 and 306 may include more or less inductors than shown. For example, the first oscillator circuit 304 may include two inductors, while the second oscillator circuit 306 may include three or more inductors. As another example, the first oscillator circuit 304 may include three inductors, while the second oscillator circuit 306 may include only one inductor.

Each of the first and second oscillator circuits 304 and 306 provides multi-stable equilibriums. For example, each of the first and second oscillator circuits 304 and 306 may include three or more stable equilibriums. Energy of a changing environmental condition or stimulus may transition the first and second oscillator circuits 304 and 306 between stable equilibriums, which, in turn, changes the output signal of the first and second oscillator circuits 304 and 306. It has been found that each of the first and second oscillator circuits 304 and 306, including at least one capacitor, at least one inductor, and at least one nonlinear resistor having multiple negative resistance regions, causes multiple stable equilibriums.

The first and second oscillator circuits 304 and 306 may form a transformer, for example. Each inductor 312, 314, 322, and 324 may include a plurality of windings around a core. The variability in the windings may induce variations in electromagnetic fields of other inductors 312, 314, 322, and 324. The amount of energy transferred from one inductor to another is proportional to the number of windings within the inductors.

For example, the inductor 312 may be a reference inductor, while the inductor 322 may be a variable inductor. The output of the inductor 312 may be constant even when a value of an environmental condition changes. The output of the inductor 322, however, may change as the value of the environmental condition changes. As such, the changing output of the inductor 322 causes the coupling between the first and second oscillator circuits 304 and 306 to change as the value of the environmental condition changes.

When the outputs of the inductors 312 and 314 are the same, a first output signal (such as an electromagnetic field) defining a first characteristic waveform pattern of amplitude and frequency results, which is indicative of a first value of an environmental condition, for example. When the output of the inductors 312 and 314 differs, a second output signal defining a second characteristic waveform pattern of amplitude and frequency results, which is indicative of a second value of an environmental condition, for example.

As one example, the environmental condition may be humidity or the presence of liquid. The first output signal may indicate a dry condition, and the second output signal may indicate a saturated condition.

As shown in FIG. 3, one degree of freedom of coupling with respect to the X axis is achieved between the oscillator circuits 304 and 306. Alternatively, the oscillator circuits may be coupled with respect to two or more degrees of freedom, which may yield output signals of increased accuracy.

Each of the first and second oscillator circuits 304 and 306 may include more resistors and capacitors than shown in FIG. 3. Additionally, each of the first and second oscillator circuits 304 and 306 may be electrically connected to a common or separate voltage source, for example.

The coupled oscillator circuit shown and described in FIG. 3 may also operate with memory-like characteristics. For example, the system 300, through the first and second oscillator circuits 304 and 306, may be programmed to memorize patterns by utilizing a distinct pattern of amplitude and frequency from environmentally induced variations.

Figure 4:
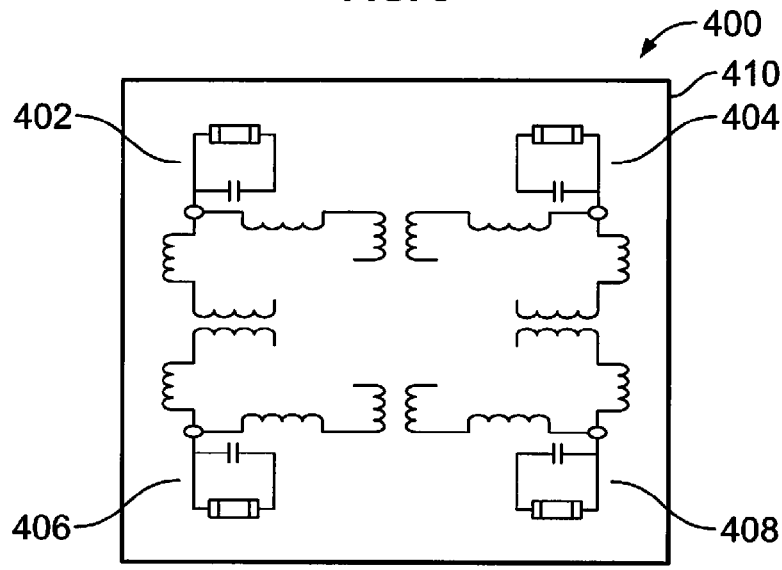
FIG. 4 illustrates a schematic circuit diagram of a system for detecting one or more environmental conditions, according to an embodiment of the present disclosure.

FIG. 4 illustrates a schematic circuit diagram of a system 400 for detecting one or more environmental conditions, according to an embodiment of the present disclosure. The system 400 is similar to the systems 100 and 300 described above, except that the system 400 may include first, second, third, and fourth oscillator circuits 402, 404, 406, and 408 mounted on a substrate 410, such as a PCB or semiconductor, for example. Alternatively, each oscillator circuit 402, 404, 406, and 408 may be mounted on a separate and distinct substrate. Each oscillator circuit 402, 404, 406, and 408 may include a plurality of inductors that couple each oscillator circuit 402, 404, 406, and 408 to at least two other oscillator circuits 402, 404, 406, and 408. Accordingly, there may be at least two degrees of coupling between each oscillator circuit 402, 404, 406, and 408. The increased number of oscillator circuits and coupling provides a single output signal (that may be detected as a waveform having amplitude and frequency components) of increased pattern variability. Alternatively, the system 400 may include more or less oscillator circuits coupled together at more than two degrees of freedom.

Figure 5:
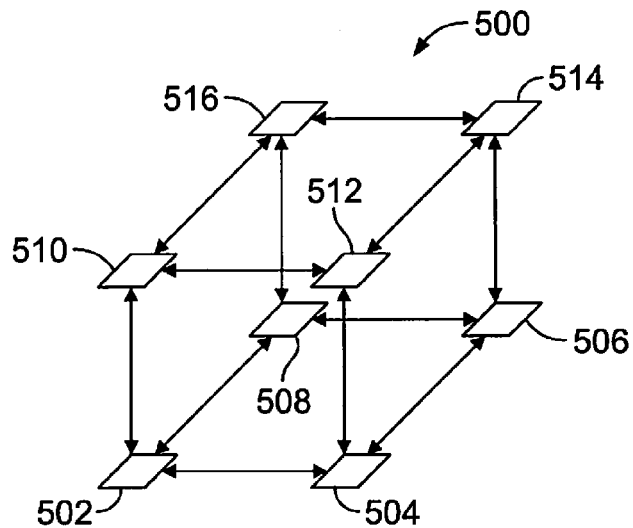
FIG. 5 illustrates a simplified perspective view of a system for detecting one or more environmental conditions, according to an embodiment of the present disclosure.

FIG. 5 illustrates a simplified perspective view of a system 500 for detecting one or more environmental conditions, according to an embodiment of the present disclosure. The system 500 is similar to the systems described above, except the system 500 includes eight oscillator circuits 502, 504, 506, 508, 510, 512, 514, and 516, each of which is coupled together at three or more degrees of freedom. The oscillator circuits 502, 504, 506, 508, 510, 512, 514, and 516 may be similar to any of those described above. As shown, the oscillator circuit 502 is coupled to the oscillator circuits 504, 508, and 510. Each oscillator circuit may be coupled to three other oscillator circuits, as shown. The system 500 may include more or less oscillator circuits arranged in different in a different shape than shown.

Figure 6:
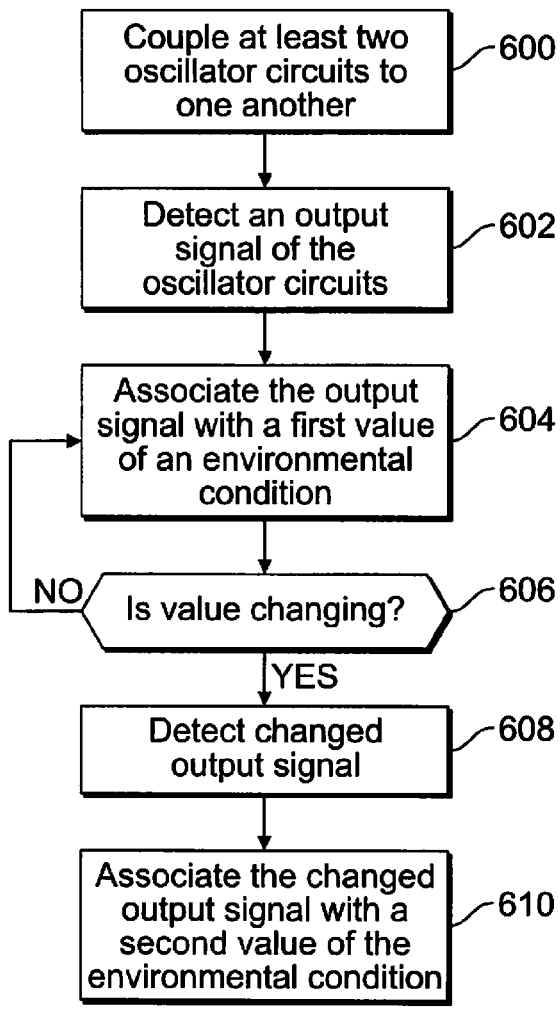
FIG. 6 illustrates a flow chart of a method of detecting one or more environmental conditions, according to an embodiment of the present disclosure.

FIG. 6 illustrates a flow chart of a method of detecting one or more environmental conditions, according to an embodiment of the present disclosure. The method begins at 600, where at least two oscillator circuits are coupled to one another. The coupling may be an electromagnetic, mechanical, and/or chemical coupling, for example. The coupling may provide or otherwise be a single output signal of the two oscillator circuits. The output signal may be detected, interpreted, or otherwise sensed as a waveform having amplitude and frequency components. The output signal may provide a unique pattern of amplitude and frequency.

At 602, the output signal of the oscillator circuits is detected, such as by a pattern recognition unit. At 604, the output signal is associated with a first value of one or more environmental conditions. The environmental conditions may be a position in an atmosphere, space, or the like (such as within a magnetic field of the Earth), attitude of a vehicle, altitude of a vehicle above sea level, vehicle velocity, ambient temperature, ambient pressure, light intensity, and/or the like.

At 606, it is determined, such as by the pattern recognition unit, if the value of the environmental condition is changing. For example, if the waveform pattern of amplitude and frequency information remains the same, the value is not changing. In this situation, the method returns to 604. If, however, the waveform pattern of amplitude and frequency changes, the output signal of the oscillator circuits has changed at 608, which means that the value of the environmental condition has also changed. Then, at 610, the changed output signal is associated with a second value of the environmental condition(s).

It is to be understood that certain embodiments of the present disclosure may be used in a recursive manner. For example, the systems described above may be repeated a desired number of time (N times), in the spirit of more complex molecular structure which give rise to different patterns, as compared with simpler structures.

As used herein, the term "central processing unit," "CPU," "computer," "control unit," "recognition unit," "module," or the like may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of such terms.

The computer or processor executes a set of instructions that are stored in one or more storage elements (such as one or more memories), in order to process data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to user commands, or in response to results of previous processing, or in response to a request made by another processing machine.

The diagrams of embodiments herein may illustrate one or more control, recognition, or processing units or modules. It is to be understood that the units or modules represent circuit modules that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the units or modules may represent processing circuitry such as one or more of a field programmable gate array (FPGA), application specific integrated circuit (ASIC), microprocessor(s), a quantum computing device, and/or the like. The circuits in various embodiments may be configured to execute one or more algorithms to perform functions described herein. The one or more algorithms may include aspects of embodiments disclosed herein, whether or not expressly identified in a flowchart or a method.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

Figure 7:
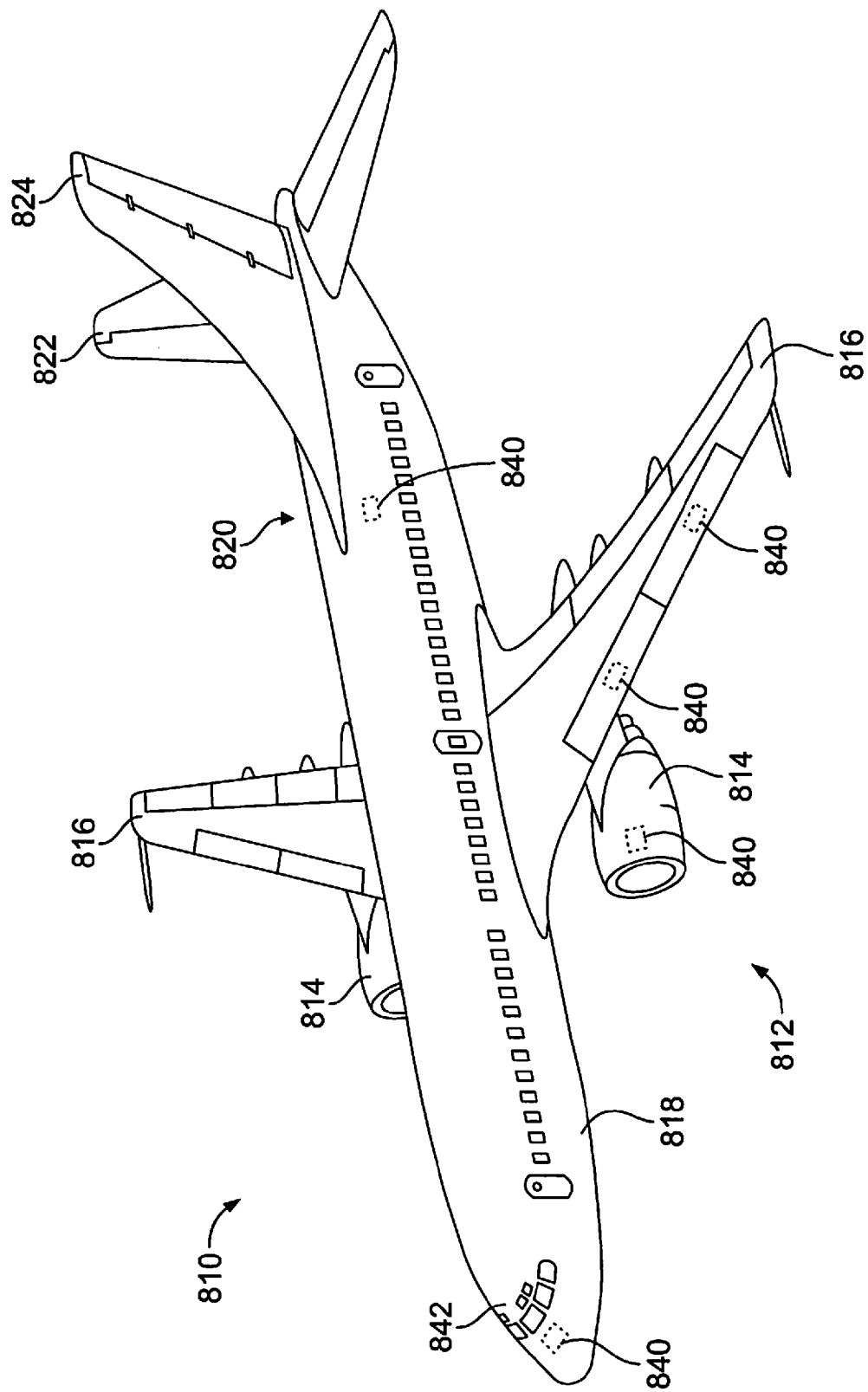
FIG. 7 is a diagrammatic representation of a perspective top view of an aircraft (or aircraft assembly), according to an embodiment of the present disclosure.

FIG. 7 is a diagrammatic representation of a perspective top view of an aircraft 810 (or aircraft assembly), according to an embodiment of the present disclosure. The aircraft 810 is an example of a vehicle in which any of the systems and methods described in the present application may be used. Alternatively, instead of an aircraft, the systems and methods of embodiments of the present disclosure may be used with various other vehicles, such as automobiles, buses, locomotives and train cars, seacraft, spacecraft, and the like. Furthermore, the systems and methods of embodiments of the present disclosure may also be used in other situations and are not limited to use on vehicles.

The aircraft 810 may include a main body having a propulsion system 812 that may include two turbofan engines 814, for example. Optionally, the propulsion system 812 may include more engines 814 than shown. The engines 814 are carried by wings 816 of the aircraft 810. In other embodiments, the engines 814 may be carried by a fuselage 818 and/or an empennage 820. The empennage 820 may also support horizontal stabilizers 822 and a vertical stabilizer 824.

The fuselage 818 of the aircraft 810 defines an internal cabin, which may include a cockpit, one or more work sections (for example, galleys, personnel carry-on baggage areas, and the like), and one or more passenger sections (for example, first class, business class, and coach sections). Each of the sections may be separated by a cabin transition area, which may include a curtain assembly having a moveable curtain that may be selectively opened and closed within an aisle.

Systems 840 for detecting one or more environmental conditions may be secured on or within various portions of the aircraft. For example, a system 840 may be secured within the cockpit 842 to detect environmental conditions such as aircraft attitude, altitude, velocity, and/or the like. Additionally, systems 840 may be secured on or within moving portions of the wings 816 to detect environmental conditions such as position, acceleration, and the like. Further, a system 840 may be positioned within the cabin of the aircraft to detect environmental conditions such as temperature, pressure, humidity, and/or the like.

In at least one embodiment, one or more of the systems 840 may be associated with the aircraft 810 itself, or another such structure, container, and/or the like. Accordingly, structural or other material property changes to the aircraft 810 may also be detected. In such an embodiment, one or more of the systems 840 may be used to detect structural changes, such as crack propagation, and other such damage, to the fuselage, wings, and/or the like. Further, one or more of the systems 840 may be used to dynamically measure various other environmental conditions exerted on the aircraft 840, such as stress during a turn, ascent, descent, and the like.

As described above, embodiments of the present disclosure provide systems and methods for providing precise indications of values of one or more environmental conditions. Embodiments of the present disclosure provide systems and methods of generating patterns of amplitude and frequency that are indicative of different values of one or more environmental conditions. The systems and methods may generate the patterns and efficiently determine the environmental conditions based on the detected patterns without computation. For example, the systems and methods may simply match the detected patterns with associated values of environmental conditions. In contrast to previous detection systems and methods, embodiments of the present disclosure are quicker, more cost-effective, more efficient, and use less computing power.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A system for detecting information content of one or more environmental conditions, the system comprising:
   a plurality of separate and distinct oscillator circuits that are coupled together, wherein the coupling of the plurality of oscillator circuits generates an output signal having a pattern of amplitude and frequency, and wherein the pattern of amplitude and frequency changes as one or more values of the one or more environmental conditions change.

2. The system of claim 1, wherein each of the plurality of oscillator circuits comprises multiple negative resistance non-linearities that provide multiple stable equilibriums.

3. The system of claim 2, wherein the system is devoid of a separate and distinct reference source.

4. The system of claim 2, wherein one or both the multiple negative resistance non-linearities or the multiple stable equilibriums of the plurality of oscillator circuits are different.

5. The system of claim 2, wherein one or both the multiple negative resistance non-linearities or the multiple stable equilibriums of the plurality of oscillator circuits are the same.

6. The system of claim 1, wherein the plurality of oscillator circuits are electromagnetically coupled together.

7. The system of claim 1, wherein the plurality of oscillator circuits are one or both of mechanically or chemically coupled together.

8. The system of claim 1, wherein the one or more environmental conditions comprises two or more of attitude, altitude, position within a volume, velocity, temperature, pressure, or light intensity.

9. The system of claim 1, further comprising a pattern recognition unit operatively coupled to the plurality of oscillator circuits, wherein the pattern recognition unit is configured to receive the output signal and determine the one or more values of the one or more environmental conditions by analyzing the pattern of amplitude and frequency.

10. The system of claim 9, wherein the pattern recognition unit matches the pattern of amplitude and frequency with an associated one of the one or more values of the one or more environmental conditions.

11. The system of claim 9, wherein the pattern recognition unit matches the pattern of amplitude and frequency with a stored pattern in a memory that is indicative of one of the one or more values of the one or more environmental conditions.

12. The system of claim 1, wherein at least one of the plurality of oscillator circuits comprises at least one inductor connected in parallel with at least on capacitor, and wherein at least one of the plurality of oscillator circuits is controlled with direct current voltage.

13. A method of detecting information content of one or more environmental conditions, the method comprising:
coupling a plurality of separate and distinct oscillator circuits together; and
generating an output signal having a pattern of amplitude and frequency through the coupling operation, wherein the pattern of amplitude and frequency changes as one or more values of the one or more environmental conditions change.

14. The method of claim 13, wherein each of the plurality of oscillator circuits comprises multiple negative resistance non-linearities that provide multiple stable equilibriums.

15. The method of claim 14, further comprising refraining from using a separate and distinct reference source.

16. The method of claim 13, wherein the coupling operation comprises electromagnetically coupling the plurality of oscillators together.

17. The method of claim 13, wherein the coupling operation comprises one or both of mechanically or chemically coupling the plurality of oscillators together.

18. The method of claim 13, wherein the one or more environmental conditions comprises two or more of attitude, altitude, position within a volume, temperature, pressure, or light intensity.

19. The method of claim 13, further comprising:
operatively coupling a pattern recognition unit to the plurality of oscillators;
receiving the output signal with the pattern recognition unit; and
using the pattern recognition unit to determine the one or more values of the one or more environmental conditions by analyzing the pattern of amplitude and frequency.

20. A vehicle comprising:
a main body including an internal cabin; and
one or more systems for detecting information content of one or more environmental conditions secured on or within the main body, each of the one or more systems comprising:
a plurality of oscillator circuits that are coupled together, wherein each of the plurality of oscillator circuits comprises multiple negative resistance non-linearities that provide multiple stable equilibriums, wherein the coupling of the plurality of oscillator circuits generates an output signal having a pattern of amplitude and frequency, and wherein the pattern of amplitude and frequency changes as one or more values of the one or more environmental conditions change; and
a pattern recognition unit operatively coupled to the plurality of oscillator circuits, wherein the pattern recognition unit is configured to receive the output signal and determine the one or more values of the one or more environmental conditions by analyzing the pattern of amplitude and frequency.

21. The vehicle of claim 20, wherein the system is devoid of a separate and distinct reference source.

22. The vehicle of claim 20, wherein the one or more environmental conditions comprises two or more of attitude of the vehicle, altitude of the vehicle, position of the vehicle within a volume of space, velocity of the vehicle, temperature, pressure, or light intensity.

* * * * *